(12) United States Patent
Dakhil

(10) Patent No.: US 9,419,545 B2
(45) Date of Patent: Aug. 16, 2016

(54) DIELECTRIC ELASTOMER POWERED BOAT AND ELECTRICITY GENERATOR AND ASSOCIATED METHOD

(71) Applicant: Farouk Dakhil, Rome (IT)

(72) Inventor: Farouk Dakhil, Rome (IT)

(*) Notice: Subject to any disclaimer, the term of this patent is extended or adjusted under 35 U.S.C. 154(b) by 290 days.

(21) Appl. No.: 14/168,318

(22) Filed: Jan. 30, 2014

(65) Prior Publication Data

US 2015/0214862 A1 Jul. 30, 2015

(51) Int. Cl.
| | | |
|---|---|---|
| *F03B 13/12* | (2006.01) | |
| *H02N 2/18* | (2006.01) | |
| *F03B 13/20* | (2006.01) | |
| *B63B 35/44* | (2006.01) | |
| *H01L 41/193* | (2006.01) | |

(52) U.S. Cl.
CPC ............ *H02N 2/185* (2013.01); *B63B 35/44* (2013.01); *F03B 13/20* (2013.01); *H01L 41/193* (2013.01); *B63B 2035/4466* (2013.01); *F05B 2220/709* (2013.01); *F05B 2240/931* (2013.01); *Y02E 10/38* (2013.01); *Y10S 415/916* (2013.01)

(58) Field of Classification Search
CPC ........... B63B 2035/4466; H02N 1/002; H02N 1/006; H02N 2/185; H02N 2/186; F03B 13/20; F03B 13/16; F03B 13/188; F03B 13/1895; Y02E 10/28
USPC ........ 310/339; 290/1 E, 42, 43, 53, 54; 322/3
See application file for complete search history.

(56) References Cited

U.S. PATENT DOCUMENTS

| | | | | |
|---|---|---|---|---|
| 7,557,456 | B2* | 7/2009 | Kornbluh | F03B 13/1845 290/42 |
| 8,987,928 | B2* | 3/2015 | Jean | F03B 11/00 290/42 |
| 9,018,786 | B2* | 4/2015 | Hama | F03B 17/06 290/43 |
| 2013/0161957 | A1* | 6/2013 | Bhat | B60G 13/14 290/53 |
| 2014/0232240 | A1* | 8/2014 | Hitchcock | H02N 2/18 310/314 |
| 2015/0270791 | A1* | 9/2015 | Sutherland | H01L 41/45 310/300 |

* cited by examiner

*Primary Examiner* — S. Joseph Morano
*Assistant Examiner* — Andrew Polay
(74) *Attorney, Agent, or Firm* — Maier & Maier, PLLC

(57) ABSTRACT

A system is disclosed in which ocean wave power compresses smart electro-active polymers (EAP) material. Dielectric elastomers (DE) convert ocean wave power pressure into electrical current. Advantageously, DE has a very high power density and elasticity. The resultant electrical power is directly used to operate an electric motor of a boat screw propeller or stored in a lithium-ion battery for any other use. The mechanical work produced by the movement of ocean waves can also be transformed into electrical current via a crank shaft and a dynamo using very strong magnets or neodymium magnets that are made of a combination of neodymium, iron, and boron (NdFeB). An underwater and above water screw propeller propagates the boat at high speed across the ocean. Electrical power produced on board during port parking or unused energy is connected to a transformer or supplied for recharging electrical vehicles or port lighting.

18 Claims, 14 Drawing Sheets

DIELECTRIC ELASTOMER POWERED BOAT AND ELECTRICITY GENERATOR AND ASSOCIATED METHOD

BACKGROUND OF THE INVENTION

This invention relates to ecologically friendly water vehicle power generators and, more particularly, to a dielectric elastomer powered water vehicle and electricity generator that reduces $CO_2$ emissions.

PRIOR ART

The concept of Dielectric Elastomers (DE) was historically discovered first around 1775 by French Nicolas-Phillipe Ledru. For example, Ledru discovered that a substance or a material can be deformed or altered in volume, length or width by an electric current. In particular, Ledru noticed mercury, in a temperature column, would rise if current was applied. Then, in 1776, Italian Alessandro Volta explained the volume changes in a Leyden jar when an electric current passed through it and he was the first to give the right interpretation of this phenomenon. Later, in 1880, German physicist Wilhelm Conrad Röntgen described how a rubber substance would increase in length if current was applied to it. This was the birth of the so-called actuators of electro-active polymers of today's understanding.

The concept was then elaborated in the early nineties when Ron Pelrine and his co-workers developed this new concept and experimentally showed in details at MIT's labs. Later, at the Stanford Research Institute (SRI), R. D. Kornbluh and colleagues found DE materials with high-speed, giant-strain and electrically actuated elastomers with excellent electro-mechanical transduction performance which, in the generator mode, produced very high power density electrical current if pressurized from the outside.

It is well known that fossil fuel is the foundation upon which the world economy of today is built. The continuous burning of fossil oil to generate electricity or to run motor engines has a dangerous and threatening side effect, which is the emission of $CO_2$. There are many technologies developed today in order to limit or decrease the emission of $CO_2$ in almost all power applications in particularly vehicles. However the rate at which the world is producing $CO_2$ is threatening in particularly if one takes into consideration the emission in the past ten years of $CO_2$ by the emerging markets in Asia and South America. In addition to all the new emissions of $CO_2$, the rain forests in South America (Amazon) and Asia are being eradicated or at least decimated for timber use in furniture and paper industry etc.

Today's level of $CO_2$ in the atmosphere is 36% higher than the beginning of the industrial revolution in Europe. It is expected that these levels of $CO_2$ will double by 2050 if the world industry of today continues at present emission levels. Unfortunately, $CO_2$ has a very long life time in the atmosphere (compared with other toxics like nitric oxides or sulfur oxides). Thus, there is an additive effect of the amounts of $CO_2$ in the air as time goes by, if past $CO_2$ emissions are not eliminated. Most of the $CO_2$ production is caused by heavy industries and transportation, such as large vehicles and ships, which count for more than 90% of world's $CO_2$ production. The use of fossil fuel also entails the transportation of crude oil across the oceans and possible catastrophic environmental effects in the events of oil spills.

Fossil fuel burning releases 6 Gt. of $CO_2$ into the air every year in addition to the cumulative emissions of the last hundred years. $CO_2$ causes the so-called greenhouse effect, wherein sunlight is permitted in but heat is trapped in from escaping into the stratosphere. Further, $CO_2$ dissolves in water to form an acid which becomes dangerous in high concentration to marine life and marine-eco-system. According to the latest estimates by the next century $CO_2$ would be 600 Gt. We can calculate a doubling of $CO_2$ every twenty eight years at present levels of energy consumption of today's rates.

Due to the change of the pH value of the oceans not only corals but thousands of species would disappear from the surface and in the water of the earth. High emissions of $CO_2$ into the atmosphere and contamination of rivers and the oceans (today the oceans have reached dangerous levels of acidity where the pH value of the water have dropped to levels in which reproduction and growth of species are being compromised in particular plankton, the main and primal source of food in all oceans and squids just to name some is endangering farming around the world and the shortage of food in the whole world would destabilize the go-political situation even further worldwide. Climate change and global warming would increase the rate of deforestation, in turn global warming and climate change thus entering in a vicious circle with catastrophic ends.

Greenhouse gas concentrations are so rapidly increasing in oceans that are not seen for millions of years. This is a dangerous process if it reaches a point of ecological transformation it will become irreversible and the impact would be unimaginably catastrophic; increased incident of disease, decreased ocean productivity due to high concentration of absorbed $CO_2$ and lack of oxygen for all ocean species shifting even their distribution.

Strictly speaking, the ocean, now at a pH of 8.1, will not turn into an acid, as its pH will not drop below 7.0. But on dissolving into the ocean, carbon dioxide instantly forms bicarbonate ions ($HCO_3^-$) and hydrogen ions—the $H^+$ of pH. The "acidification" resulting from the current carbon dioxide emissions is massive and rapid, a combination that is almost certainly unprecedented in Earth history.

Further, it is also known that flowing wind carries a kinetic energy equivalent to 140 BTU/hr/sq. ft. at approximately 20 mph. said air stream would carry with it an amount of CO2 equivalent to energy consumption of 28,000 BTU/hr/sq.ft. By comparison to wind energy solar energy (photo voltaic) is about 60 BTU/hr/sq.ft. Comparatively, biomass is even less of an energy carrier: 1 BTU/hr/sq.ft. Thus, wind energy is also lucrative source of energy if one could generate this available potential energy in wind while collecting in fame $CO_2$.

The problem with hydrogen is really very critical because it does pollute the atmosphere even more than internal combustion engines during the actual production of liquid hydrogen. Further, the energy power density of fuel cells is way below that of internal combustion (IC) engines. The energy power density of the dielectric elastomers (DE)-technology in comparison is almost double that of an internal combustion driven vehicle (4 W/g). The low energy density has been the main problem in all past alternative energy global and serious solutions including my own old patents regarding the liquid nitrogen technology.

Accordingly, a need remains for a DE-powered boat and electricity generator in order to overcome prior art shortcomings. The present invention satisfies such a need by providing a DE-powered boat and electricity generator that is convenient and easy to use, lightweight yet durable in design, versatile in its applications, and designed for improved energy power density as compared to internal combustion engines.

BRIEF SUMMARY OF THE INVENTION

In view of the foregoing background, it is therefore an object of the present invention to provide a simple power generating device and mechanism that utilizes the ocean wave energy/power to propel a boat and/or generate electrical power in which dielectric elastomers DE and a rotating crank shaft is applied for said power generation. Ocean waves have a much higher energy density, almost 100 times more than wind and/or any solar photovoltaic or flat collectors application.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

It is noted the purpose of the foregoing abstract is to enable the U.S. Patent and Trademark Office and the public generally, especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

BRIEF DESCRIPTION OF THE SEVERAL VIEWS OF THE DRAWING

The novel features believed to be characteristic of this invention are set forth with particularity in the claims. The invention itself, however, both as to its organization and method of operation, together with further objects and advantages thereof, may best be understood by reference to the following description taken in connection with the accompanying drawings in which:

Figure 1:
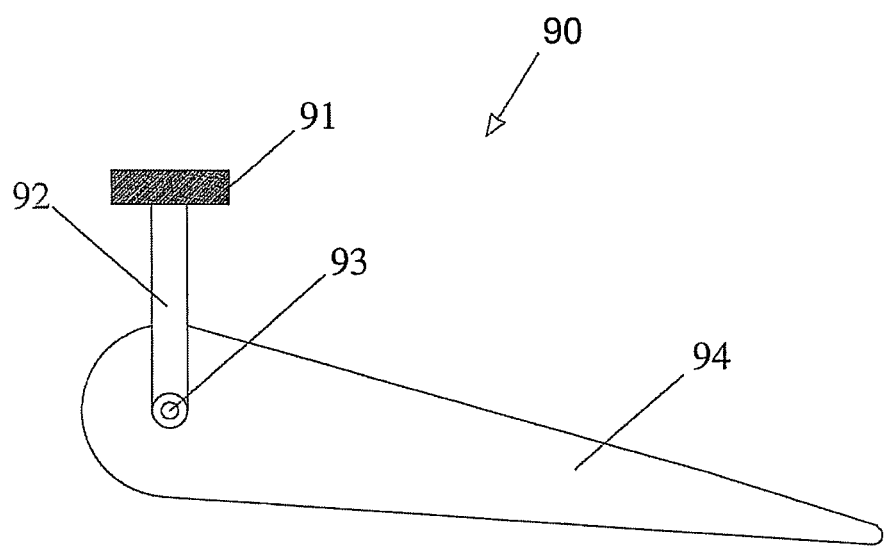
FIG. 1 shows elevational views of a non-limiting exemplary embodiment of a "wing" fin which can oscillate in phase with ocean waves, in accordance with the present invention.

Those skilled in the art will appreciate that the figures are not intended to be drawn to any particular scale; nor are the figures intended to illustrate every embodiment of the invention. The invention is not limited to the exemplary embodiments depicted in the figures or the shapes, relative sizes or proportions shown in the figures.

DETAILED DESCRIPTION OF THE INVENTION

The present invention will now be described more fully hereinafter with reference to the accompanying drawings, in which a preferred embodiment of the invention is shown. This invention may, however, be embodied in many different forms and should not be construed as limited to the embodiment set forth herein. Rather, this embodiment is provided so that this application will be thorough and complete, and will fully convey the true scope of the invention to those skilled in the art. Like numbers refer to like elements throughout the figures.

The illustrations of the embodiments described herein are intended to provide a general understanding of the structure of the various embodiments. The illustrations are not intended to serve as a complete description of all of the elements and features of system and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "present invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The below disclosed subject matter is to be considered illustrative, and not restrictive, and the appended claims are intended to cover all such modifications, enhancements, and other embodiments which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The system of this invention may be referred to generally in FIGS. 1-10 may provide a dielectric elastomer powered water vehicle and electricity generator that reduces $CO_2$ emissions. It should be understood that the present invention may be used to propel and generate electricity for many different types of boats, and should not be limited to the uses described herein.

Referring generally to FIGS. 1-10, the present disclosure is a further contribution to ecological possible solution to $CO_2$ reduction initiative worldwide. This proposed mechanism is to clean renewable generate electrical power for a boat in order to propagate upon water. This present invention utilizes the power of ocean waves to generate useful electrical power. The specification of this mechanism and its mode of operation directly embodied on board of a boat to propel a screw propeller under water or a power propeller above water as will be shown in our drawings and description of the same.

Some concepts have been proposed before to address this subject matter in the hope to find a possible satisfactory contribution to a global ecological solution in order to lower human $CO_2$ emissions. This patent application is a continuation of this effort to find a possible solution to the problem of global warming and pollution in such a way that it would encompass the whole cycle of energy production which initiate from non-polluting renewable energy source right from the beginning of the energy cycle i.e. from power plants down to zero-emission vehicles and other useful devices as shown in above mentioned patents. So far, auto motors like the HCCI, electrical motors, fuel-cell or hybrid vehicles have not given any satisfactory solution because they all have placed the problem only backwards at the initial of the energy cycle i.e. at the power generation plant that would supply the required energy to charge the batteries for the electrical cars or to produce hydrogen, in the case of fuel-cells, from natural gas, or any other similar solution of the kind. Gasoline vehicles produce directly to the atmosphere carbon dioxide and nitrogen oxides due to its combustion of fuel diesel and/or benzene.

The mechanism proposed for clean electricity generation is based on the compression and decompression of so-called smart materials dielectric elastomers (DE) and a mechanical mode which utilizes a crank shaft to turn a dynamo power generator by the wave forces of the ocean: working principle of the dielectric elastomers. Dielectric elastomers are a type of electroactive polymer (EAP) that have dielectric electrodes on both sides.

When pressure is applied to the surface area of the electrodes, electrical current will flow across the capacitors.

The power generation of the DE is given by the equation: $P_{eq} = \epsilon_0 \epsilon_r V^2/Z^2$. Therefore, $V^2 = Z^2 P_{eq}/\epsilon_0 \epsilon_r$, where $P_{eq}$ is the equivalent electromechanical pressure, V is the voltage and $\epsilon_0$ is the vacuum permittivity, $\epsilon_r$ is the dielectric constant of the material and Z is the thickness of the elastomer material. (The equivalent electromechanical pressure $P_{eq}$ is twice the electrostatic pressure $P_{el}$.)

This technology was developed in the field of artificial muscles functioning in the field of robotics, in which a high voltage would bring polymer material into movement in a specific way (according to a physical principle so-called Maxwell stress: DE contracts in the direction of the current and expand perpendicular to the electric field).

"In the past decade, dielectric elastomers have emerged as promising multifunctional smart energy-transduction materials in several actuation, sensing, and electric power generation applications. As actuators, dielectric elastomers have demonstrated strains (over 300%) and specific energy density (over 3.4 J/g) larger than that observed in any other field-activated smart material. In generator mode, dielectric elastomers have been shown to generate electricity from mechanical motion with high specific energy densities (0.4 J/g) and predicted high efficiencies (80-90%). In addition to superior performance, dielectric elastomers have two features that distinguish them from other energy-transduction materials: They are made from low cost materials that can be easily fabricated in large-area sheets and they are very compliant. This allows good impedance matching where strain in the material result from human body motion, combustion, or from wind or ocean waves."

The DE dielectric elastomer material can be made of a multi-layer to increase power generation. Thus, all DE units in the present application may be made of a multi-layer DE material which is also made elastic to re-bounce any impact upon the material layers. Further, conventional DE material has a strain of 370% and above; stress of up to 7.2 MPa; fast response and long lifetime; high resilience, light weight, scalable; and is a low cost material.

Wave energy is a well-established form of energy resource today and has a relatively good energy density. The equation that governs wave energy is given by the following: in deep water where the water depth is larger than half the wavelength, the wave energy flux is:

$$P = \frac{\rho g^2}{64\pi} H_{m0}^2 T_e \approx \left(0.5 \; \frac{\text{kW}}{\text{m}^3 \cdot \text{s}}\right) H_{m0}^2 T_{e2}$$

The above formula states that wave power is proportional to the wave period $T_e$ and to the square of the wave height $H_{m0}$. When the significant wave height is given in meters, and the wave period in seconds, the result is the wave power in kilowatts (kW) per meter of wave front length. As the waves propagate, their energy is transported. The energy transport velocity is the group velocity. As a result, the wave energy flux, through a vertical plane of unit width perpendicular to the wave propagation direction, is equal to:

$$P = E c_g,$$

with $c_g$ the group velocity (m/s). Due to the dispersion relation for water waves under the action of gravity, the group velocity depends on the wavelength λ, or equivalently, on the wave period T. Further, the dispersion relation is a function of the water depth h. As a result, the group velocity behaves differently in the limits of deep and shallow water, and at intermediate depths.

Thereafter, the present application shows a method by which ocean wave power can be used in a novel mechanism to produce electrical current in two ways:
1. Through the conduction of wave power to a special mechanism with a piston in order to pressurize DE multi-layer material; and
2. Through wave power transmitted to a crank shaft to create a rotational movement in order to produce additional electric current in a stator of a dynamo/electric power generator.

Power Generation of the Device

In a non-limiting exemplary embodiment, as water flows along the "wings" or fins of the DE "turbines", the wings or fins may generate an upward thrust or movement creating an oscillation of the fins in a perpendicular cyclic movement. The velocity of the oscillation or period may be directly proportional to the wave strength and wave height onto the wings. The fins or wings may compress and decompress the DE material in a cyclic manner so that at the electrodes shown in FIG. 2 a voltage difference is created and thus current would flow at the electrodes of the DE multi-layer material. This electrical current can be immediately used to move an electric motor connected to the screw propellers of the boat in order to propagate the actual boat forward or operate mechanically a crank shaft. The generated electrical current is either stored in batteries (not shown) and/or directly connected to electric motor of a screw propeller.

Figure 1A:
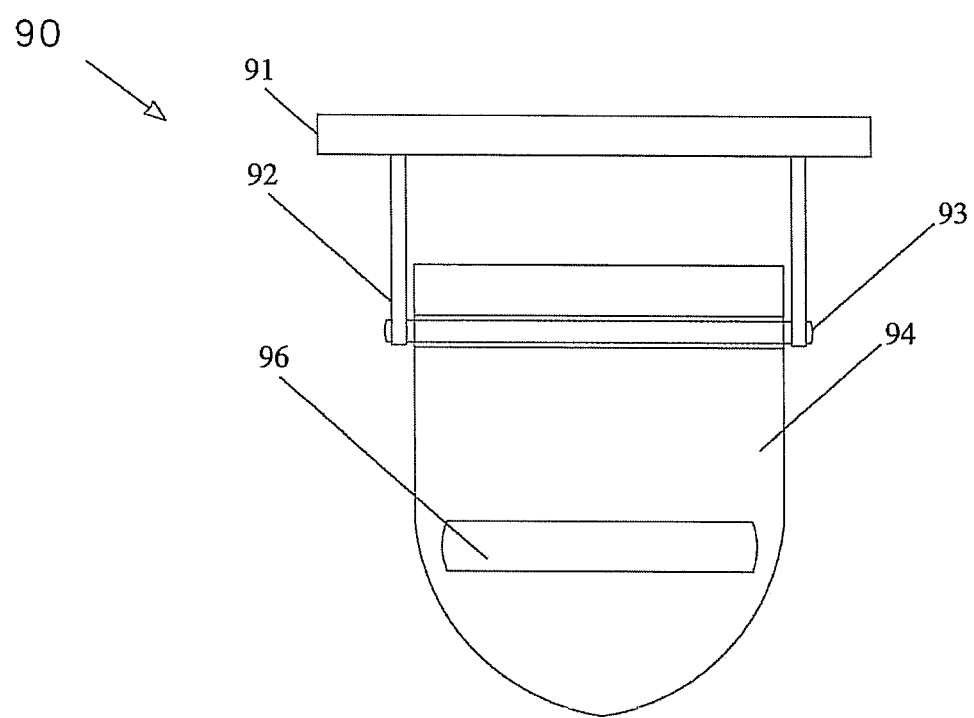
FIG. 1a is a top plan view of the "wing" shown in FIG. 1.
Figure 2:
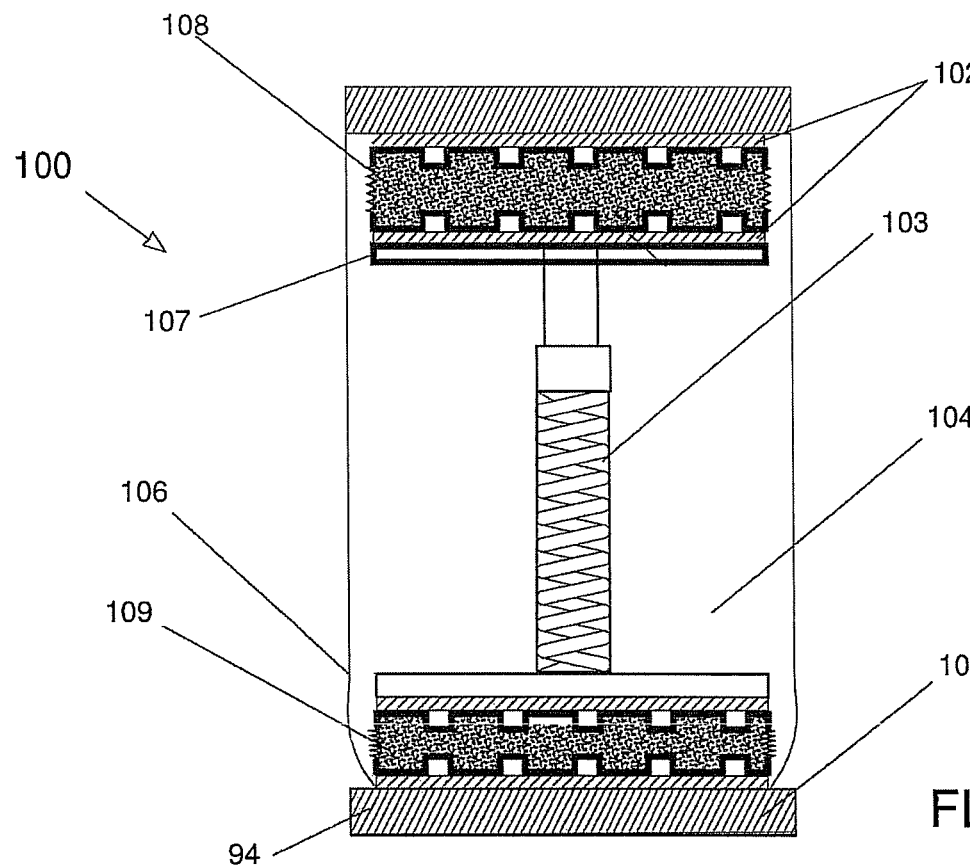
FIG. 2 shows a partial cross-sectional view of a non-limiting exemplary embodiment of the implementation of the underwater "wing" connected to a moving piston with the DE-material.

FIGS. 1 and 1a show the actual fin or what we call "wing" 90 that is made of carbon fiber-reinforced polymer and is exposed to the wave current in open sea and thus can oscillate up and down as ocean waves exert a force against fine end 94. Thereafter, with the propagation of ocean waves, the fin or wing 90 can move perpendicularly up and down in a circular pattern with a hinge mechanism having a pivot-like structure allowing the fin end 94 to move up and down. The fin/wing 94 may be connected to a solid bar structure 92 which may also be mounted at the carbon fiber-reinforced polymer structure of the boat with a solid material 91, such as stainless steel. Structure 91 may hold a moving hinge structure 93 along an axis of rotation that allows fin/wing 90 to oscillate up and down. Thus, the oscillating movement of fin/wing 90 may be transmitted to a piston mounted at the end of it on top of area 94, as shown in FIG. 2. The fin/wing end 94 may have an inlet, carved depression socket 96 which may have substantially the right dimensions to insert a piston solid base, as shown in FIG. 2. Further, wing 94 can also have the form of a whale's tail or many other possible forms. The inside of the hinge 93 may be coated by a lubricant to reduce friction and protect the actual hinge structure and material from salt water corrosion and tear and wear. One example of a lubricant would be the newly developed material called "SLIP". SLIP is a self-healing material which would reduce friction of the oscillating fin/wings to a possible minimum.

SLIP is a nano-structure lubricant capable of repelling salt water or any other complex liquids or even complex-like crude oils. It is a stable and maintains a low contact angle hysteresis (<2.5°), self-healing after damage, and it can function at high pressure of up to 680 atm. It is applicable to inexpensive and low surface-energy material like in the present case of carbon reinforced polymer. SLIP can also be applied to all the surfaces of said wing 90 so as to make it totally hydrophobic and impermeable to sea water and hermetically sealed in order to protect the inside mechanism of the whole embodiment of the proposed application.

Further, the hinge mechanism that holds the oscillating wing is coated with said SLIP nano-particle material which helps reduce friction and thus enhance efficiency of the system and protect the mechanism from salt water corrosion and is an excellent sealing (water proof) material. Recent developments in nanotech coating material have no hazard to humans, they do not contain any type of silicone or petroleum (no silver or zinc nano-particles). Such coating material may be a siliceous structure material making the surface hydrophobic. They are effective and 100% green.

Further, the simple oscillation of the wing structure 94 may create a forward propulsion force that adds to the forward force propulsion movement of the boat.

Referring to FIG. 2, a non-limiting exemplary embodiment of the piston 100 may be mounted on end-top of a fin/wing 94 in such a way that the wave force may be transmitted at point of fin/wing 94 to the piston end 106. At both ends of piston 100, i.e. between fin/wing 94 and piston edge 106 there may be placed two multi-layer DE materials to absorb the oscillation forces transmitted by the ocean waves. Piston 100 may mainly have the function to counter act the movement produced by the fins or said wings in such a way that an up and down oscillation movement may be created in the DE material at both ends of said piston 100.

During such oscillation, the DE material may be continuously compressed and decompressed and thus produces electrical current at a high density value. The DE material structure may be connected to two electrodes. Positive and negative junctions may be made of a multi-layer elastic structure each with a N-P-junction which are either connected to a battery or directly to an electrical motor which may propel the boat electric motor moving helical rotor as shown in FIG. 3.

Structure 104 may be a hermetically sealed material which may encapsulate substantially all of the piston and DE material parts, including spring 103, to prevent sea water from infiltrating the inner mechanism of piston 100. Further, cushions 108 and 109 may be formed of multi-layer well-isolated N-P-junctions and may have a maximum elasticity spring-like structure to allow a compression and de-compression movement as fin/wing 94 structure pushes DE cushions 108 and 109 up-ward or down-ward respectively through which current by the DE material is thus produced at the N-P-junctions.

Figure 3A:
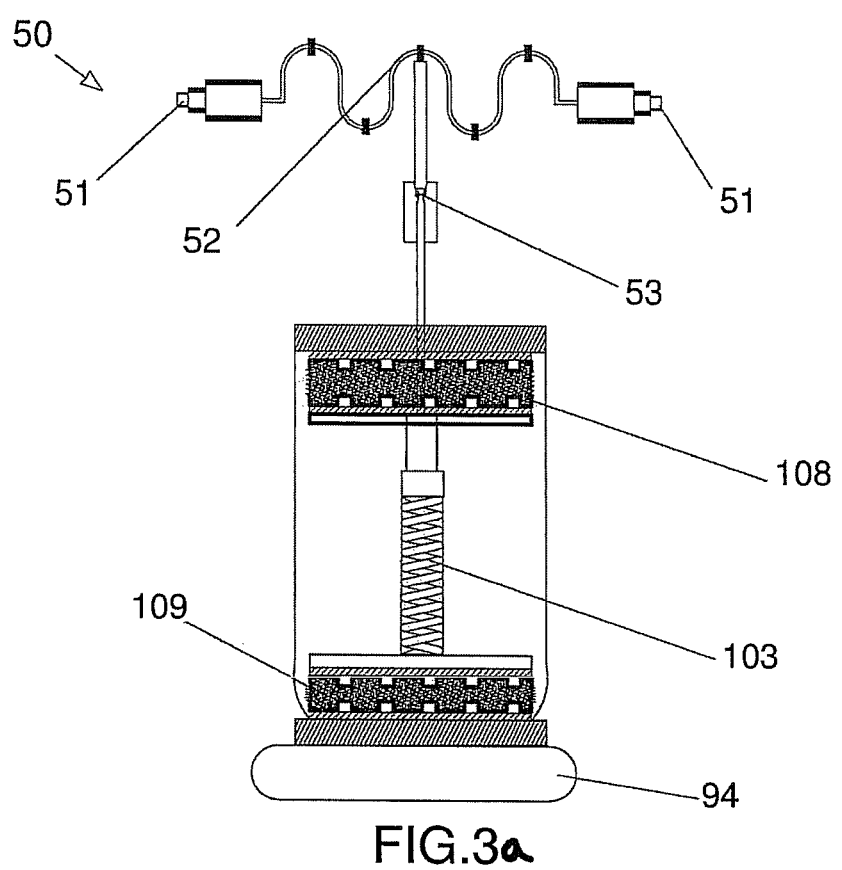
FIG. 3a shows a partial cross-sectional view of an internal non-limiting exemplary embodiment of a crank shaft connected to dynamo in order to produce electric power by transforming mechanical movements caused by ocean waves into a crank shaft and a dynamo.

FIG. 3a shows a non-limiting exemplary embodiment of how the piston 50 compresses the DE multi-layer material cushions 108 up and 109 down as it is moved by the ocean wave forces transmitted by fin/wing 94. As piston 50 is compressed by ocean wave forces, spring 103 allows piston to oscillate and DE-material cushions to compress and un-compress creating a continuous up and down movement or oscillation. Further, at the end arm or spring 103, there is a junction box 53 containing a flexible mechanism to allow circular movement of crank shaft 52 in such a way that such circular rotation is transmitted to a stator dynamo electric generator 51 at both ends of said crank shaft 52. Dynamo and stators are well known conventional technologies for those skilled in the art. This mechanism may be referred to as a "DE-turbine" because it produces electrical current/power.

Figure 3B:
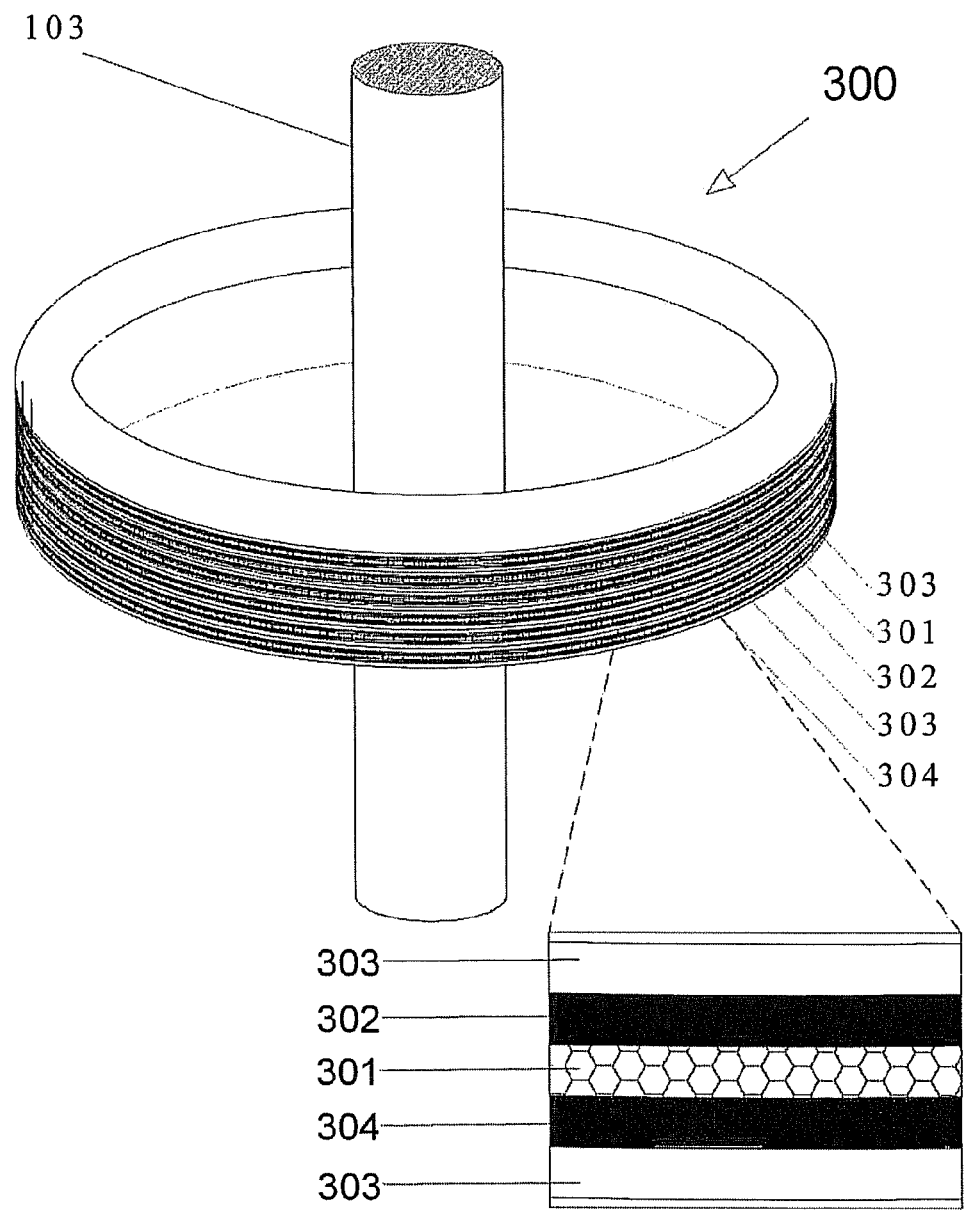
FIG. 3b shows the inner cross section details of the multilayer DE cushion placed on both sides of the piston in order to compress and decompress said cushion to generate electrical current.

In a non-limiting exemplary embodiment, FIG. 3b shows a perspective view of a multilayer DE structure 300 provided with inside shaft 103. Each layer is composed of five strati: 301 is the actual DE material sandwiched within two plates for the electrodes 302 and 304, respectively. This whole DE material 301 and conductors 302-304 structure is then encapsulated within two layers of an elastic silicon/rubber insulation material 303 in order to insulate and protect the main the structure 301. The structure creates a truck wheel-like embodiment through which the main device's shaft passes through.

Figure 3C:
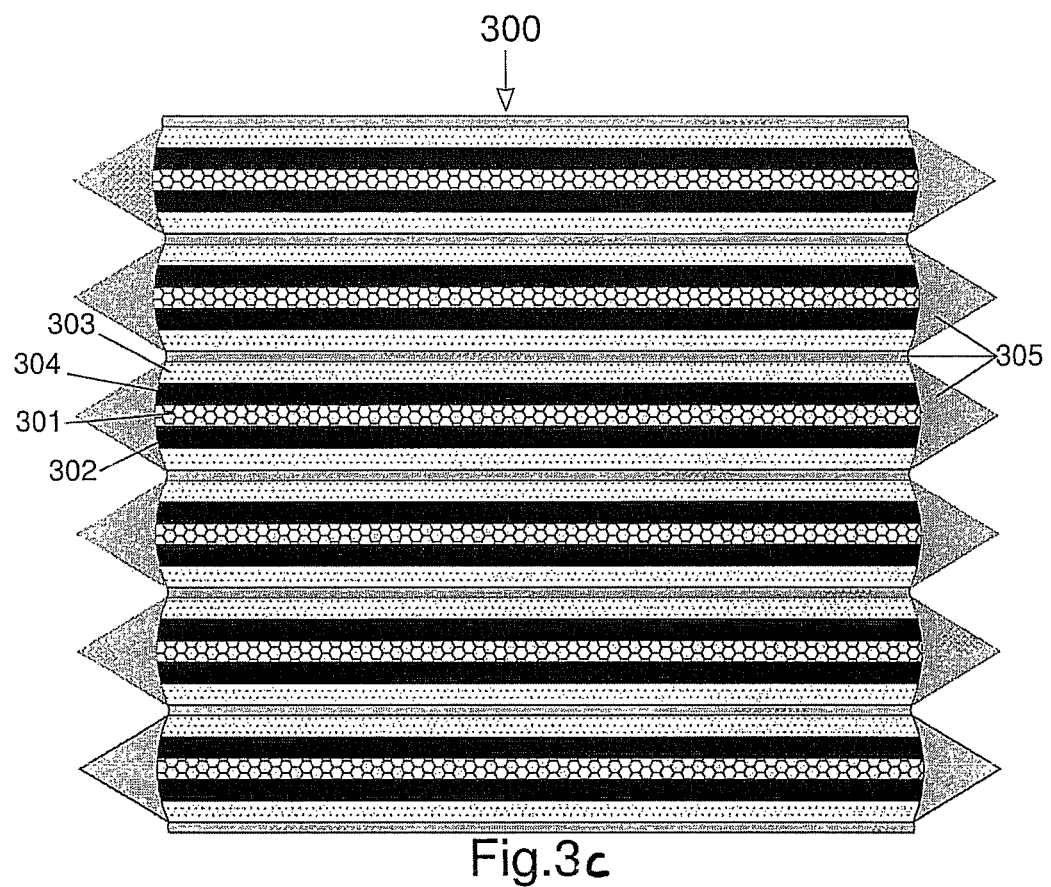
FIG. 3c shows the De cushion in great details with plural layers each isolated with a PN junction.

FIG. 3c shows an inside cross section of the multi-layer DE cushion 300 (108/109) that is composed of six layers each containing the actual DE material 301 placed in contact with two electrodes 302 and 304 respectively building the P-N junction through which current will flow. Said cushion 300 (108/109) may have a tire (donut) like structure. Further, said electrodes then encapsulated inside a carbon reinforced polymer material 305 in order to absorb the impact movements of the oscillating fin/wing thus compressing and decompressing the actual DE material to generate electrical power.

Figure 4A:
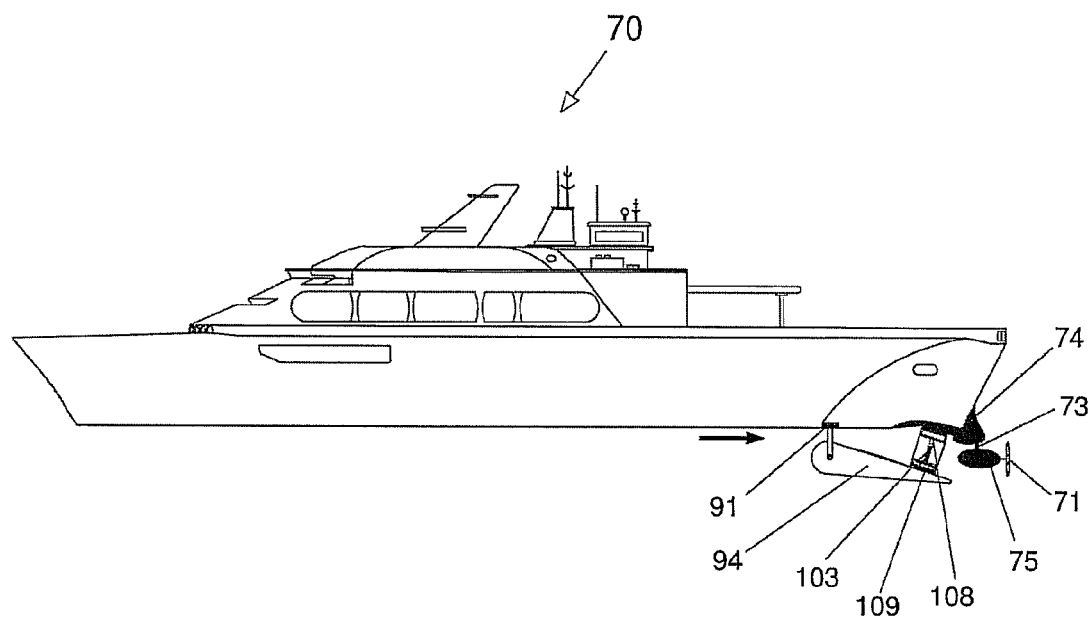
FIG. 4a shows an elevation view of a non-limiting exemplary embodiment of a DE-powered boat in a side view showing the underwater fin/wing and the screw propeller of the boat which has a moving pivot allowing maneuvering of the boat in its fixed position.

FIG. 4a shows a non-limiting exemplary embodiment of boat 70 with DE "turbines" 75 (firmly embodied in a stainless steel structure 74) under water for generating electrical power as fin or "wing" 94 oscillates with wave propagation. As the wing oscillates, multilayer DE cushion 108 and 109 is pressurized thereby producing electrical current to power screw propeller 71 in order to move forward the boat in the desired direction. The simple oscillation movement of wing 94 propagates the boat in a forward direction just like a whale tail when it oscillates up and down. This additional power enhances the total power supply for boat 70.

Figure 4B:
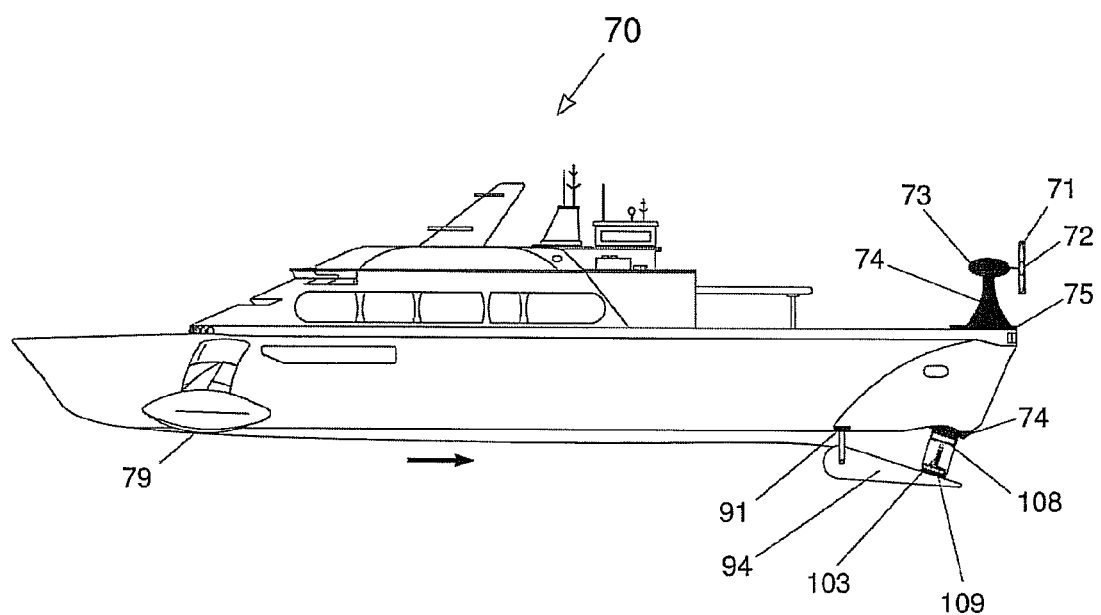
FIG. 4b shows a side elevational view of a non-limiting exemplary embodiment of a boat with above-water, electrically powered helical turbines (a set of DE-turbines underneath the boat with a stabilizing side holders and a hover powered screw propeller by the DE-turbines)

FIG. 4b shows a non-limiting exemplary embodiment of boat 70 with a helical screw propeller 71 and boat stabilizer 79. Electrical motor 73 is connected to a battery or directly to an electric transmitter (not shown) at the DE turbines. As shown, the mechanical movement of fin/wing 94 lies outside the closed structure of boat 70 thereby inhibiting any water to infiltrate piston mechanism where fin/wing 94 is fixed at solid block 91. Thus, the piston is completely water proof and insulated within the boat main structure. Helical screw propeller 71 is mounted and fixed to main boat structure by a stainless steel solid base 74. As a non-limiting example, two types of boats may be employed, one with an upper helical on deck screw propeller that would need a boat stabilizer 79 and another with an underwater helical screw propeller as shown in FIGS. 5 and 7.

Figure 5:
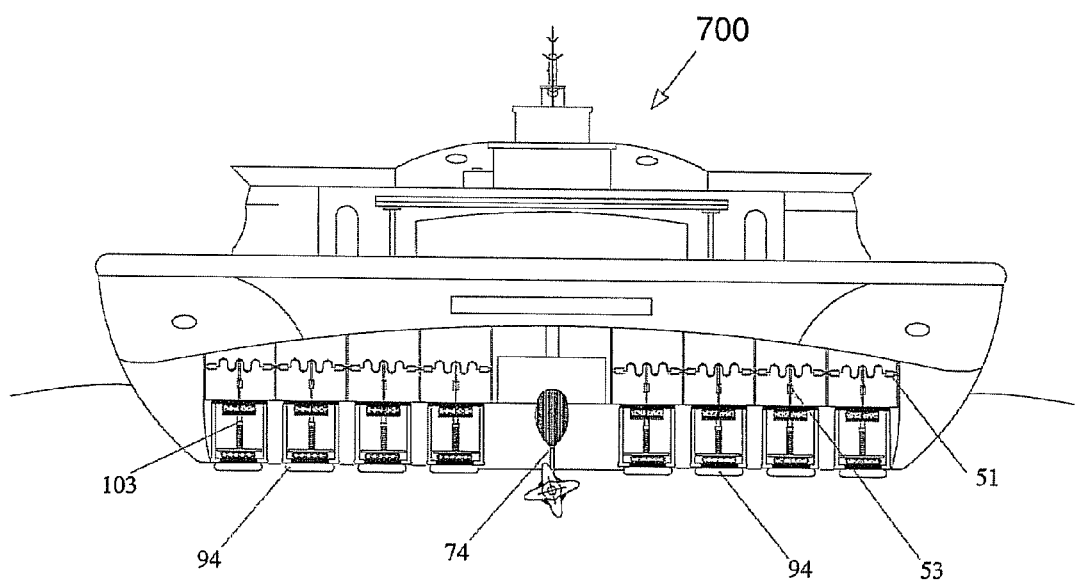
FIG. 5 shows boat in a rear elevational view with power generating mechanism in place as in FIG. 4a side view.

FIG. 5 shows a non-limiting exemplary embodiment of a back view of boat 700 with screw propeller under water of boat 700. In this embodiment, an additional electric power supplier in the form of mechanical power generator or so-called dynamo 51 is provided. Such a dynamo 51 may be connected by a junction box 52 to facilitate and convert oscillation movement of DE turbines 706 into circular movement in a stator to produce electric current indeed. DE turbines have corresponding multi-layer dielectric elastomer cushions 108/109 in order to generate additional electric current as well. Electrical power produced by both DE material and mechanical rotational work may be used for all needs of the boat hereafter proposed in this application.

Figure 6:
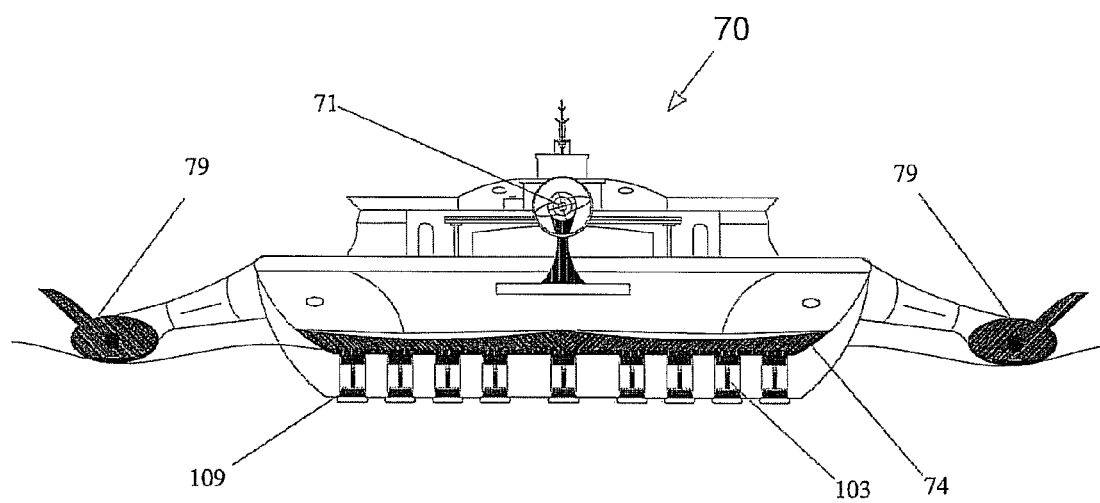
FIG. 6 shows a rear elevational view of a DE-powered Boat with the DE-turbines in an insulated water proof compartment underneath the boat with stabilizing side holders as in FIG. 4a and with above-water, electrically powered helical turbines.

FIG. 6 shows a non-limiting exemplary embodiment of boat 70 with helical screw propeller 71 on board above water. The above-water screw propeller has floating stabilizers 79 on both sides of boat 70 as shown, in order to compensate the boat movement when the screw propeller generates forward propulsion force. This embodiment has nine under water DE turbines, which is one more turbine in place of the screw propeller when placed under water, as shown in FIGS. 5 and 7. All nine DE turbines are embodied in stainless steel structure 74. As the piston in turbine moves up and down by wave propagating power, DE multi-layer cushions 108/109 are also pressurized thus current will flow to power the above board helical propeller 71 with electric power for boat motion.

Figure 7:
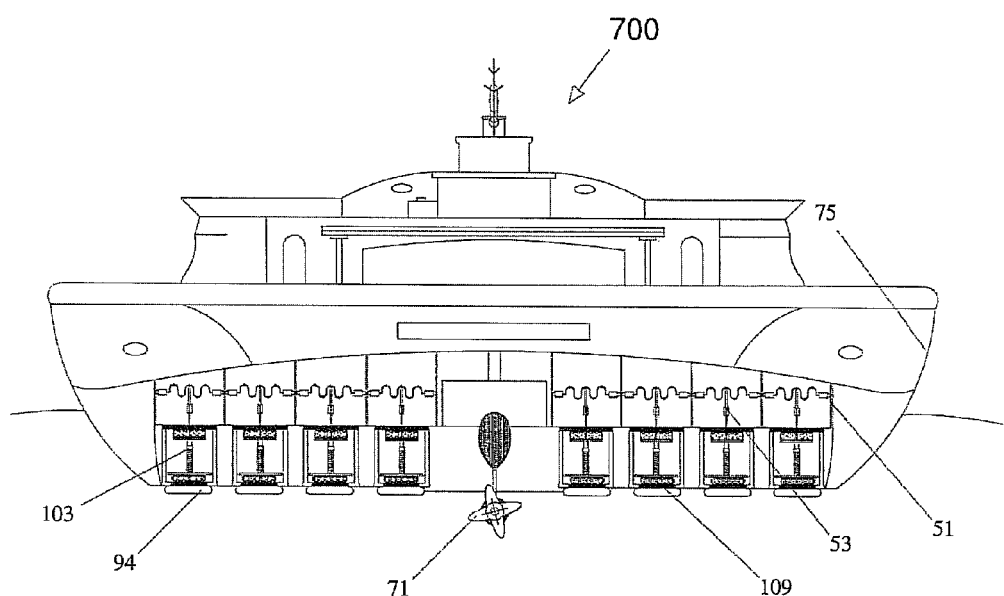
FIG. 7 shows a rear elevational view of the boat with a craft screw propeller under water that utilizes the electrical power from the nine DE turbines to power it.

FIG. 7 shows a non-limiting exemplary embodiment of boat 700 with helical screw propeller 71 under water. This embodiment has eight under water DE turbines with crank shaft and dynamo power generators in addition to the DE cushions 108/109. All eight DE turbines are embodied in stainless steel structure 74. As the piston in turbine moves up and down by wave propagating power, DE multi-layer cushions 108/109 are also pressurized thus current will flow to power the above board helical propeller 71 with electric power for boat motion generated by both DE material and electric dynamos 51.

Figure 8:
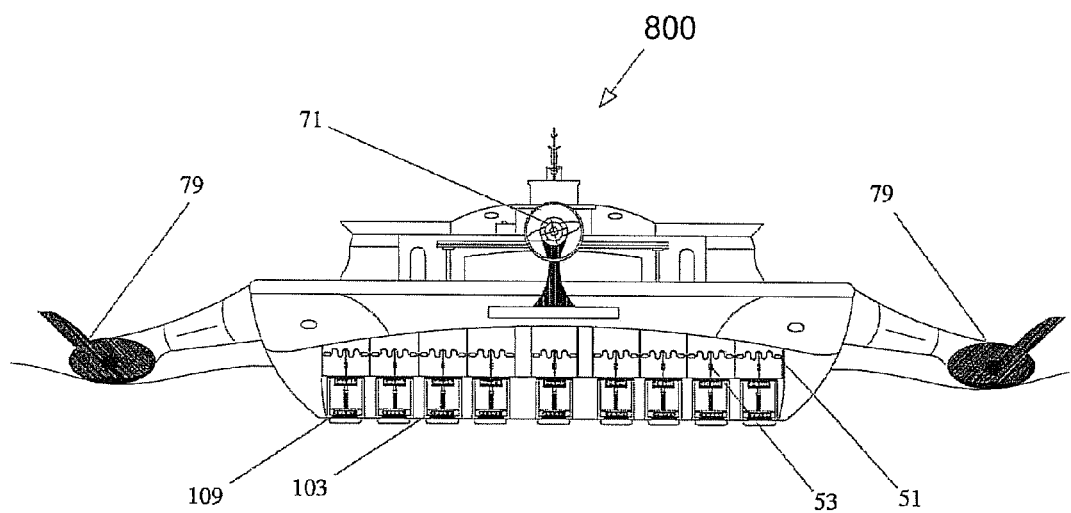
FIG. 8 shows a rear elevational view of the boat with on deck screw propeller and eight DE-turbines.

FIG. 8 shows a non-limiting exemplary embodiment boat 800 with two side floating stabilizers 79 and an above-water helical screw propeller 71 on board boat 800. Again, this embodiment has nine DE turbines with crank shaft and dynamo power generators in addition to the DE cushions 108/109. All nine DE turbines and dynamos 51 are embodied in stainless steel structure 74. As the piston in turbine moves up and down by wave propagating power, DE multi-layer cushions 108/109 are also pressurized thus current will flow to power the above board helical propeller 71 with electric power for boat motion generated by both DE material and electric dynamos 51. There may be nine DE turbines with dynamos 51 all placed under water in a waterproof sealed stainless steel embodiment 74.

Figure 9:
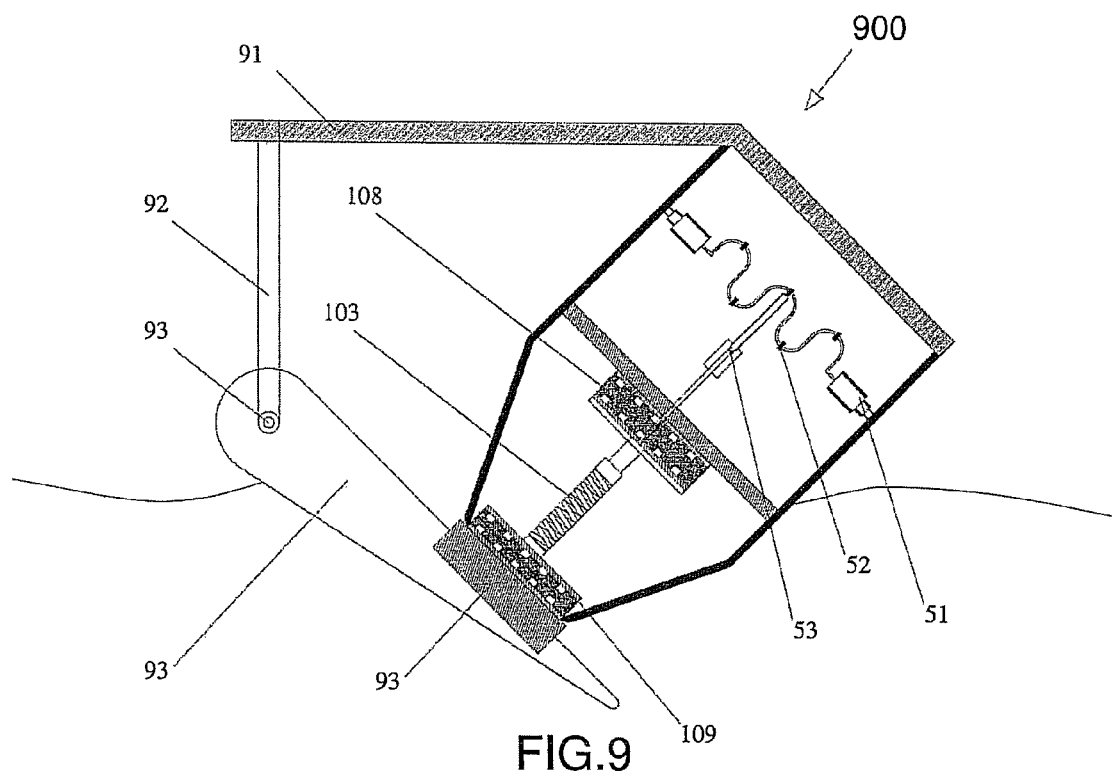
FIG. 9 shows an enlarged side elevational view of a non-limiting alternate embodiment which uses the ocean surface wave power to turn turbine(s) in order to directly generate electricity.

FIG. 9 shows a non-limiting exemplary embodiment of DE turbine 900 in a power generation embodiment in order to generate electoral power directly from ocean wave energy. This embodiment we shall call "Wave-Rider" WR. In this embodiment the fin/wing 94 is placed in front of the DE turbine 900 facing the incoming ocean waves. As the waves moves fin/wing 94 in a continuous oscillation along hinge mechanism 93 supported by structure 91. Both multi-layer DE cushions 108 and 109 will start producing electrical current due to wave power transmission compressing and decompressing said Cushions 108/109 with the help of piston 103. In addition, electrical current can be produced as waves' movements' power will be transmitted to crank shaft 52 through box 53 in which the mechanism allows the crank shaft to rotate thus creating a rotational movement inside a stator of a dynamo/power generator 51.

Figure 10:
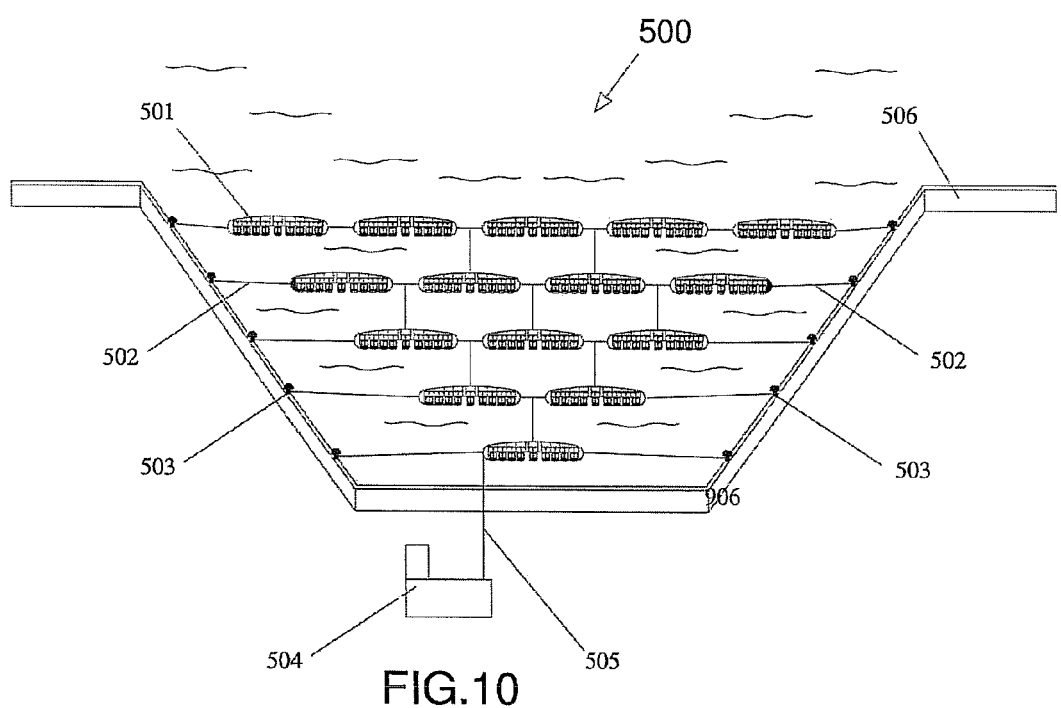
FIG. 10 shows a non-limiting exemplary embodiment of wave power generators interconnected with an electric strong cable that is then conducted to a land electric grid wherein the power generator assembly is fixed to a harbour or other rigid structure connected to a mushroom-like solid pillar.

FIG. 10 shows a non-limiting exemplary embodiment of an assembly 500 of a group of nine "Wave Riders" (WR) 501, as described in FIG. 9, interconnected by an electric cable 502 to supply electric power to an on shore power station 504 through cable 505. The group of nine WR 501 is connected by a strong stainless cable 502 which is fixed to a solid short steel mushroom like pillar 503. All WR 501 are again fixed in a concrete harbour structure 506 to protect the power-generation park and the entire assembly. This assembly can, however, be placed off shore and anchored into the sea floor by strong cables in a similar way without causing much higher costs.

This embodiment can be amplified and arranged in a series of "Wave-Rider" power generators in such a way to create an interconnected power generation park from which a direct-current cable is connected to a power grid on land. This assembly has the advantage compared with other similar applications like the underwater "helical" blade turbine (similar to a normal helical wind power generator with the turbine blades and the power generator placed underwater).

Initially, such an exemplary assembly needs not to be anchored on the ocean floor which is very cost intensive. Secondly, underwater turbine blades are best made of aluminium-magnesium alloy or other materials which in practice break over time as in the experiments done on the Hudson River in NYC and in Ireland with double helical turbines with blades. Thirdly, it is not necessary to turn the wave wings towards the direction of the wave currents (as described above) which is the case in all conventional underwater turbines and, thus again, reduce costs. Fourthly, the power density of ocean waves (Kw/m) is much higher than wind power density. For example, the power density concentrated in a wave motion per square meter compared to a good wind energy location can reach 100 times that of wind energy density/m². Fifthly, ocean waves are always propagating while wind or solar are not always available: winds sometimes does not blow and sun power is only 6-10 hours available per day.

Certainly wave power can vary according to the speed and wave amplitude as shown in the equation above. However, waves are available day and night. Finally, such a wave power generation park compared to wind turbines have no or minimal noise pollution and can be built away from peoples' sight, a problem that many civil communities are discussing for aesthetical and environmental sight pollution in addition to noise problems.

Advantages of the proposed invention: even in the case of change of wave direction the wave wing would nevertheless continue to oscillate up and down no matter in which direction the waves are coming in, like during ebb and tides. This ensemble can be amplified and arranged in a series of "Wave-Rider" power generators in such a way that it would create an interconnected power generation park from which a direct current cable is connected to a power grid on land. This assembly has the advantage compared with other similar applications like the underwater "helical" blade turbine (similar to a normal helical wind power generator with the turbine blades and the power generator are placed underwater) that our assembly needs not to be anchored on the ocean floor which is very cost intensive. Secondly, underwater turbine blades are best made of aluminum-magnesium alloy or other materials which in practice do break with time very easily as in the experiments done on the Hudson River in NYC and in Ireland with double helical turbines with blades. Thirdly, we do not need to turn the wave wings towards the direction of the wave currents as described above which is the case in all underwater turbines known up to date and thus again reduce costs. Fourthly, the power density of ocean waves (Kw/m) is much higher than wind power density). Fifthly, ocean waves are always propagating while wind or solar are not always available: winds sometimes do not blow and sun power is only 6-10 hours daily available. Certainly wave power can vary according to the speed and wave amplitude as shown in the equation given above. However, waves are available day and night. Finally, such a wave power park compared to wind turbines have no or a minimum of noise pollution and can be built away from peoples' sight, a problem that many civil communities are now a day's discussing also for aesthetically and environmental sight pollution in addition to noise problems.) the power density concentrated in a wave motion per square meter compared to a good wind energy location can reach 100 times that of wind energy density per square meter.

Comparing our application with the so-called ocean "serpent" system of collecting wave energy, our invention has the advantage that while the serpent is directed with its "head" towards the wave forces and can roughly utilize 20% of this wave energy or force/power, our wave rider is directed with its wing towards the waves and thus utilizes more than 90% of the wave energy, force/power potential. While our wing/whale tail 94 oscillates with the waves as they hit its tip the serpent would only dive under the waves as they propagate across and not exploit a maximum of its potential force/power: not as in our application. Further in a similar buoy system where the upward thrust of the wave energy is only utilized to compress the DE material to generate electricity it only exploits a minimum part of the total wave energy while our "Wave Rider" or wing/whale tail (94) exploits the maximum amount of energy potentially available in the propagating wave force as said above, because the wing 94 of our "Wave-Rider" is at all times facing frontally the incoming waves thus transmitting the maximum amount of wave energy to the DE material and the crankshaft to generate electric power as described above.

While the invention has been described with respect to a certain specific embodiment, it will be appreciated that many modifications and changes may be made by those skilled in the art without departing from the spirit of the invention. It is intended, therefore, by the appended claims to cover all such modifications and changes as fall within the true spirit and scope of the invention. In particular, with respect to the above description, it is to be realized that the optimum dimensional relationships for the parts of the present invention may include variations in size, materials, shape, form, function and manner of operation.

What is claimed is:

1. A marine electricity generator, comprising:
   a fin having a distal end and a proximal end hingedly coupled to a support structure;
   a piston, the piston comprising a sealed housing having a first end a second end and enclosing a cavity therein, a spring disposed within the housing, a first dielectric elastomer cushion disposed between the first end of the housing and the spring, a second dielectric elastomer cushion disposed between the second end of the housing and the spring, a shaft coupled to the spring and extending through the second dielectric elastomer cushion, and further extending externally of the housing, and a crankshaft, coupled to the shaft and operatively coupled to a dynamo.

2. The electricity generator of claim 1, wherein each dielectric elastomer cushion comprises a plurality of isolated PN junction layers.

3. The electricity generator of claim 2, wherein each dielectric elastomer cushion comprises five isolated PN junction layers.

4. The electricity generator of claim 2, wherein each layer is isolated by an elastic silicon and rubber insulation material.

5. The electricity generator of claim 2, wherein each isolated PN junction layer comprises a dielectric elastomer material sandwiched within a PN junction.

6. The electricity generator of claim 1, wherein each dielectric elastomer cushion has an annular shape.

7. A marine vehicle comprising the electricity generator of claim 1.

8. A marine vehicle comprising a plurality of electricity generators of claim 1.

9. A static marine structure comprising the electricity generator of claim 1.

10. A static marine structure comprising a plurality of electricity generators of claim 1.

11. A marine vehicle, comprising:
    a fin having a distal end and a proximal end hingedly coupled to a support structure, the support structure being coupled to a lower surface of the marine vehicle;
    a piston, the piston comprising a sealed housing having a first end a second end and enclosing a cavity therein, a spring disposed within the housing, a first dielectric elastomer cushion disposed between the first end of the housing and the spring, and a second dielectric elastomer cushion disposed between the second end of the housing and the spring;

a shaft coupled to the spring and extending through the second dielectric elastomer cushion, and further extending externally of the housing; and a crankshaft, coupled to the shaft and operatively coupled to an electric generator, the electric generator being operatively coupled to an electrical system of the marine vehicle.

12. The marine vehicle of claim 11, wherein each dielectric elastomer cushion comprises a plurality of isolated PN junction layers.

13. The marine vehicle of claim 12, wherein each dielectric elastomer cushion comprises five isolated PN junction layers.

14. The marine vehicle of claim 12, wherein each layer is isolated by an elastic silicon and rubber insulation material.

15. The marine vehicle of claim 12, wherein each isolated PN junction layer comprises a dielectric elastomer material sandwiched within a PN junction.

16. The marine vehicle of claim 11, wherein each dielectric elastomer cushion has an annular shape.

17. The marine vehicle of claim 11, further comprising at least one stabilizer.

18. The marine vehicle of claim 11, further comprising at least one above-water propeller.

* * * * *